United States Patent
Chiou

(10) Patent No.: US 8,209,583 B2
(45) Date of Patent: *Jun. 26, 2012

(54) ERROR-CORRECTING APPARATUS INCLUDING MULTIPLE ERROR-CORRECTING MODULES FUNCTIONING IN PARALLEL AND RELATED METHOD

(75) Inventor: Rong-Liang Chiou, Hsin-Chu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 218 days.

This patent is subject to a terminal disclaimer.

(21) Appl. No.: 12/686,390

(22) Filed: Jan. 13, 2010

(65) Prior Publication Data

US 2010/0115382 A1    May 6, 2010

Related U.S. Application Data

(63) Continuation of application No. 11/160,927, filed on Jul. 15, 2005, now Pat. No. 7,673,222.

(51) Int. Cl.
*H03M 13/00* (2006.01)
(52) U.S. Cl. .................. 714/755; 714/786; 714/784
(58) Field of Classification Search .................. 714/755, 714/786
See application file for complete search history.

(56) References Cited

U.S. PATENT DOCUMENTS

| | | |
|---|---|---|
| 4,653,052 A | 3/1987 | Doi |
| 5,206,864 A | 4/1993 | McConnell |
| 5,434,886 A | 7/1995 | Kazawa |
| 5,708,665 A | 1/1998 | Luthi |
| 5,715,262 A | 2/1998 | Gupta |
| 5,812,603 A | 9/1998 | Luthi |
| 5,875,199 A | 2/1999 | Luthi |
| 5,968,198 A | 10/1999 | Hassan |
| 5,996,103 A | 11/1999 | Jahanghir |
| 6,011,817 A | 1/2000 | Bergmans |
| 6,044,485 A | 3/2000 | Dent |
| 6,108,811 A | 8/2000 | Nakamura |
| 6,209,112 B1 | 3/2001 | Stevenson |
| 6,446,236 B1 | 9/2002 | McEwen et al. |
| 6,580,930 B1 | 6/2003 | Fulghum |
| 7,047,474 B2 | 5/2006 | Rhee |
| 7,236,536 B2 | 6/2007 | Hochwald |
| 7,237,173 B2 | 6/2007 | Morita |
| 7,478,306 B2 | 1/2009 | Okamoto |
| 7,673,222 B2 * | 3/2010 | Chiou .......................... 714/774 |
| 2003/0026028 A1 | 2/2003 | Ichihara |
| 2003/0192001 A1 | 10/2003 | Maiuzzo |
| 2004/0030984 A1 | 2/2004 | Renaud |
| 2004/0061964 A1 | 4/2004 | Akamatsu |
| 2005/0078640 A1 | 4/2005 | Kim |
| 2005/0120286 A1 | 6/2005 | Akamatsu |

* cited by examiner

*Primary Examiner* — Guy Lamarre
(74) *Attorney, Agent, or Firm* — Winston Hsu; Scott Margo

(57) ABSTRACT

An apparatus for error-correcting an input signal to generate an output signal. The apparatus includes an unreliable-location determining module for determining unreliable-locations of the input signal and generating an indication signal accordingly, a first error-correcting module for error-correcting the input signal to generate a first candidate signal, a second error-correcting module coupled to the unreliable-location determining module for error-correcting the input signal with reference to the indication signal to generate a second candidate signal, and a selecting module coupled to the first and second error-correcting modules for selecting one of the first and second candidate signals to be the output signal.

7 Claims, 2 Drawing Sheets

ERROR-CORRECTING APPARATUS INCLUDING MULTIPLE ERROR-CORRECTING MODULES FUNCTIONING IN PARALLEL AND RELATED METHOD

CROSS REFERENCE TO RELATED APPLICATION

This application is a continuation application for U.S. patent application Ser. No. 11/160,927 filed Jul. 15, 2005 (now issued as U.S. Pat. No. 7,673,222).

BACKGROUND

The present invention relates to error-correcting coding, and more particularly, to an error-correcting apparatus including multiple error-correcting modules functioning in parallel and a related method.

Various types of noise, distortion, and interference are commonly seen factors that deteriorate signal communication quality and cause the output of a communication channel to be different from its input. Error-correcting coding is a technique that can be adopted in digital communication systems to help transceivers resist the above-mentioned factors, reduce the probability of errors, and enhance the reliability of the outputted data.

Concatenated coding is a kind of error-correcting coding technique that implements multiple levels of coding. Generally speaking, inner and outer codes are commonly applied to provide two levels of coding. For example, convolutional codes or Trellis-Coded-Modulation (TCM) codes could be used as the inner codes, which help to overcome scattered random errors. Reed-Solomon (RS) codes or BCH codes could be used as the outer codes, which help to overcome burst errors.

Please refer to FIG. 1, which shows a block diagram of a receiver for decoding concatenated codes. The receiver 100 shown in FIG. 1 comprises a demodulator 110, an inner decoder 120, a deinterleaver 130, and an outer decoder 140. The demodulator 110 may comprise analog-to-digital converters for converting analog signals into digital signals, a mixer for transferring frequency from a radio frequency (RF) into an intermediate frequency (IF) or baseband, filters for anti-aliasing, a synchronization means for timing or frequency recovery, and an equalizer for compensating fading or impairment channel effects. After some or all of the above-mentioned operations are performed, the demodulator 110 then generates a demodulated signal.

Depending on which kind of inner code is utilized, the inner decoder 120 could be implemented by a convolutional decoder or a TCM decoder, which inner decodes the demodulated signal to generate an inner code decoded signal. Then, the deinterleaver 130 deinterleaves the inner code decoded signal to generate a deinterleaved signal. The deinterleaver 130 plays an important role in scattering some kinds of burst noise in order to share the error-correction burden.

Depending on which kind of outer code is utilized, the outer decoder 140 could be implemented by an RS decoder or a BCH decoder. For example, when RS codes are utilized as the outer codes, an RS error decoder can be used as the outer decoder 140. The RS error decoder 140 can correct a maximum of t errors for (n, k, 2t) RS codes. In other words, the RS error decoder 140 has an error correction capability of t errors. However, in some communication systems, especially in terrestrial broadcasting systems, complex multi-path channels would induce severe fading or interference that the equalizer of the demodulator 110 cannot compensate entirely. In such circumstances, burst noise may causes errors of the inner decoder 120 to propagate to the outer decoder 140 and even the deinterleaver 130 cannot scatter them efficiently. The outer decoder 140 with only t-error correction capability may not be sufficient.

If the demodulator 110 is able to detect burst noise or the inner decoder 120 has a mechanism to mark unreliable symbols as erasure indicators, the outer decoder 140 can be upgraded to an RS error-erasure decoder. Different from the above-mentioned RS error decoder, an RS error-erasure decoder can correct x errors and y erasures for (n, k, 2t) RS codes, only if $2x+y \leq 2t$. That is, if an RS error-erasure decoder implements the outer decoder 140, a correction capability of t errors or 2t erasures can be achieved. In other words, the RS error-erasure decoder 140 has the opportunity to correct codewords with an actual error number that is larger than t if it is informed with some error locations marked as erasures.

However, for receiver-ends, sometimes it is not easy to mark erasure locations exactly and efficiently. Besides, the inner decoder 120, which can be implemented by a TCM decoder or a Viterbi decoder, might have a memory effect that causes error propagation to occur. For example, a few distorted symbols occurring at the output end of the demodulator 110 may be corrected by Viterbi algorithm at the moment, but may cause error propagation for decoding some clear symbols later. For a transceiver that has blind data paths, it is difficult to identify whether a data-stream at the output end of the inner decoder 120 is corrected or just error propagated. In this situation, the uncertainty of an exact erasure marking procedure increases in severe burst noise and in low signal-to-noise ratio (SNR) situations. Then, an erroneous location marking for erasure will deteriorate the error correction capability of error-erasure decoder.

SUMMARY OF THE INVENTION

According to the claimed invention, an apparatus for error-correcting an input signal to generate an output signal is disclosed. The apparatus comprises an unreliable-location determining module for determining unreliable-locations of the input signal and generating an indication signal accordingly, a first error-correcting module for error-correcting the input signal to generate a first candidate signal, a second error-correcting module coupled to the unreliable-location determining module for error-correcting the input signal with reference to the indication signal to generate a second candidate signal, and a selecting module coupled to the first and second error-correcting modules for selecting one of the first and second candidate signals to be the output signal.

According to the claimed invention, a method for error-correcting an input signal to generate an output signal is disclosed. The method comprises determining unreliable-locations of the input signal and generating an indication signal accordingly, error-correcting the input signal to generate a first candidate signal, error-correcting the input signal with reference to the indication signal to generate a second candidate signal, and selecting one of the first and second candidate signals to be the output signal.

These and other objectives of the present invention will no doubt become obvious to those of ordinary skill in the art after reading the following detailed description of the preferred embodiment that is illustrated in the various figures and drawings.

DETAILED DESCRIPTION

In the following descriptions, (n, k, 2t) RS codes will be used as an example for illustrating the ideas of the present invention. To avoid codewords with t errors or less than t errors from being mistakenly decoded on account of erroneous erasure marking procedures, and to enhance error-correcting performance for codewords with more than t errors, the following embodiment includes both an error decoder and an error-erasure decoder functioning in parallel to decoded an RS encoded signal.

Figure 1:
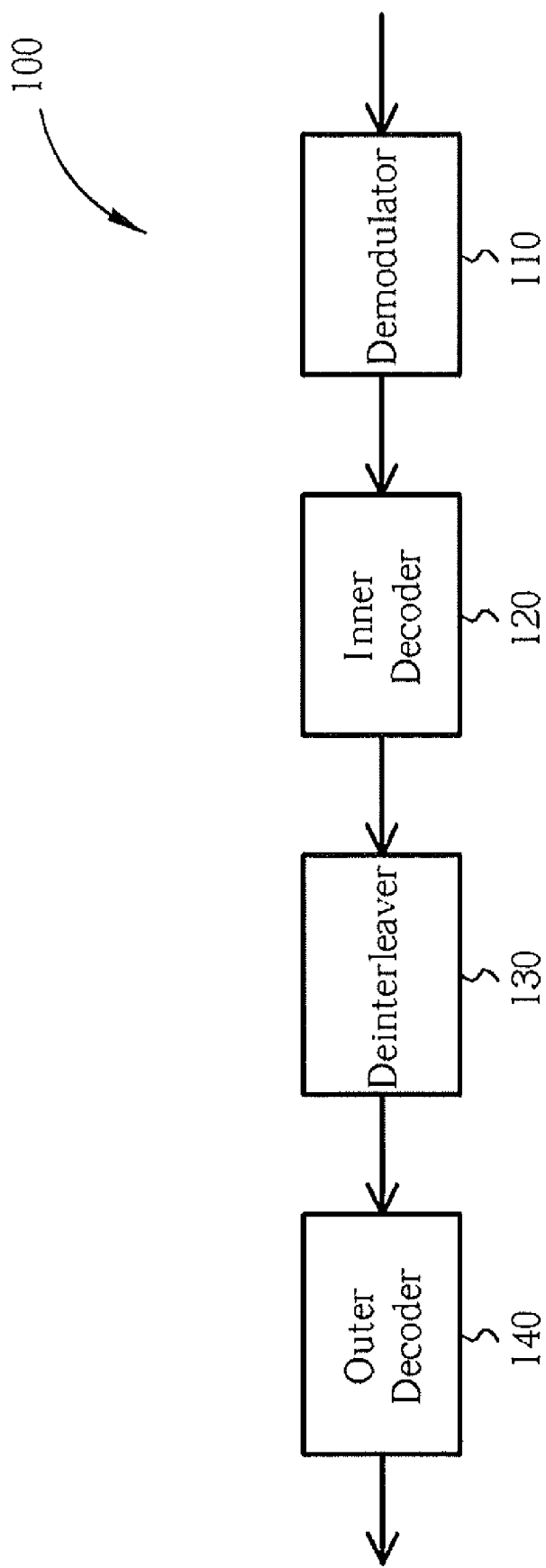
FIG. 1 shows a block diagram of a receiver for decoding concatenated codes according to a related art.
Figure 2:
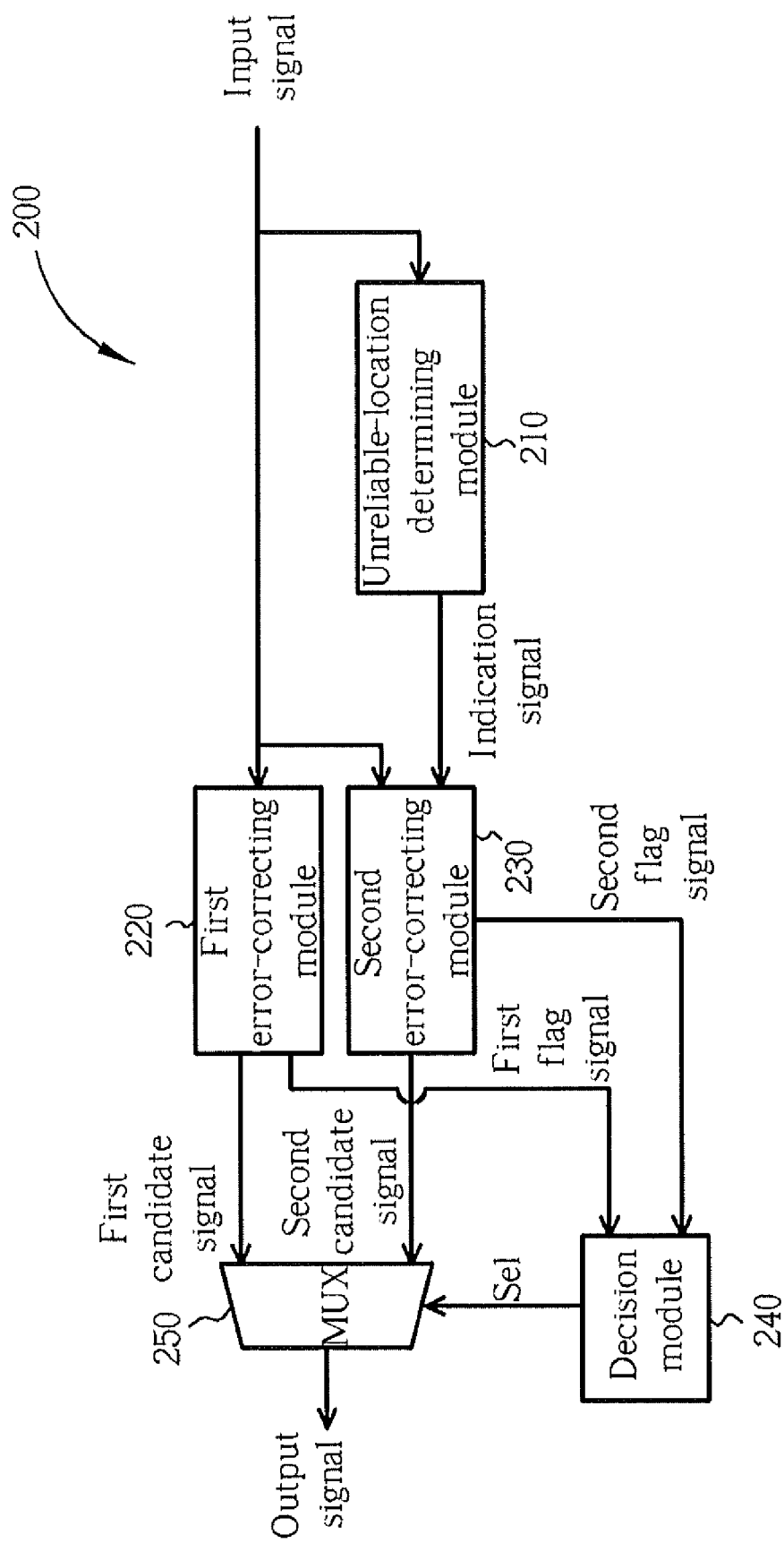
FIG. 2 shows a block diagram of an apparatus for error-correcting an input signal to generate an output signal according to an embodiment of the present invention.

FIG. 2 shows a block diagram of an apparatus for error-correcting an input signal to generate an output signal according to an embodiment of the present invention. The input signal is an (n, k, 2t) RS encoded signal. The apparatus 200 of this embodiment includes an unreliable-location determining module 210, a first error-correcting module 220, a second error-correcting module 230, a decision module 240, and a multiplexer 250. The unreliable-location determining module 210 determines unreliable-locations of the input signal and generates an indication signal for indicating unreliable-locations of the input signal accordingly. If the apparatus 200 is set in a receiver receiving concatenated codes, the unreliable-location determining module 210 can function with reference to burst noise locations determined by a demodulator of the receiver. The unreliable-location determining module 210 can also function with reference to a Viterbi algorithm adopted by an inner decoder of the receiver.

In this embodiment, an error decoder 220 implements the first error-correcting module 220. The error decoder 220 decodes the input signal to generate a first candidate signal. Since the error decoder 220 functions without reference to the indication signal, the performance of the error decoder 220 will not be influenced by an erroneous erasure marking procedure possibly performed by the unreliable-location determining module 210. The error decoder 220 can correct a maximum of t errors per codeword.

In this embodiment, an error-erasure decoder 230 implements the second error-correcting module 230. The error-erasure decoder 230 decodes the input signal with reference to the indication signal to generate a second candidate signal. More specifically, the error-erasure decoder 230 decodes the input signal by regarding the unreliable-locations indicated by the indication signal as erasure locations. A total of x errors and y erasures of a codeword can be corrected successfully only if $2x+y \leq 2t$. That is, with the additional information provided by the indication signal, it is possible that the error-erasure decoder 230 can correct a maximum of 2t erasures. In other words, if all error locations of a codeword can be precisely determined by the unreliable-location determining module 210 as erasures locations and no erroneous erasure location is marked, the error-erasure decoder 230 will be able to correct a maximum of 2t errors, which means twice the error correcting capability of the error decoder 220.

In this embodiment, the error decoder 220 and the error-erasure decoder 230 function in parallel. For each codeword of the input signal, both the error decoder 220 and the error-erasure decoder 230 attempt to decode the codeword to respectively generate the first and second candidate signals. This strategy ensures the error-correcting capability of the apparatus 200 when the number of errors in a codeword of the input signal is not larger than t, and enhances the error-correcting capability of the apparatus 200 when the number of errors in a codeword of the input signal is larger than t.

In addition, when decoding codewords of the input signal, the error decoder 220 further generates a first flag signal to indicate whether each codeword of the input signal is successively error-corrected by the error decoder 220. Similarly, when decoding codewords of the input signal with reference to the indication signal, the error-erasure decoder 230 also generates a second flag signal to indicate whether each codeword of the input signal is successively error-corrected by the error-erasure decoder 230. The decision module 240 and the multiplexer 250 can be thought of as a selecting module of the apparatus 200. According to the first and second flag signals, the selecting module selects one of the first and second candidate signals to be the output signal. For example, since the error decoder 220 is a relatively reliable decoder and will not be influenced by an erroneous erasure marking procedure possibly performed by the unreliable-location determining module 210, as long as the first flag signal indicates that the input signal is successively error-corrected by the error decoder 220 to generate the first candidate signal, the decision module 240 can control the multiplexer 250 to select the first candidate signal to be the output signal. Only if the first flag signal indicates that the input signal is not successively error-corrected by the first error decoder 220 to generate the first candidate signal, the decision module 240 further examines the second flag signal to determine whether to select the second candidate signal to be the output signal. If the second flag signal indicates that the input signal is successively error-corrected by the error-erasure decoder 230 to generate the second candidate signal, the decision module 240 can then control the multiplexer 250 to select the second candidate signal to be the output signal.

In other words, the error-correcting apparatus 200 of the above-mentioned embodiment includes both the error decoder 220 and the error-erasure decoder 230 at the same time, and lets the error decoder 220 and the error-erasure decoder 230 functioning in parallel. For codewords with t errors or less, the error decoder 220 will be able to error-correct the codewords successively, and the first candidate signal will be selected as the output signal of the apparatus 200. For codewords with more than t errors, the apparatus 200 will further determine whether the second candidate signal generated by the error-erasure decoder 230 can be selected as the output signal of the apparatus 200.

Please note that FIG. 2 shows only a schematic block diagram according to the embodiment of the present invention. If it is required, a deinterleaver can further be set in front of the input ends of the error decoder 220 and the error-erasure decoder 230, to deinterleave the input signal before it is inputted into the error decoder 220 and the error-erasure decoder 230, and to deinterleave the indication signal before it is inputted into the error-erasure decoder 230.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An receiver for receiving concatenated codes over a network, the receiver comprising:
    a first error-correcting module for error-correcting an input signal of the concatenated codes to generate a first candidate signal when the input signal found containing errors less than a threshold; and
    a second error-correcting module, for error-correcting the input signal with reference to an indication signal for indicating unreliable-locations of the input signal of the concatenated codes to generate a second candidate signal when the input signal is found containing errors more than the threshold.

2. The receiver of claim 1, wherein the input signal of the concatenated codes is a Reed-Solomon (RS) encoded signal.

3. The receiver of claim 1, wherein the first error-correcting module comprises an error decoder, and the second error-correcting module comprises an error-erasure decoder.

4. The receiver of claim 1, wherein the first and second error-correcting modules function in parallel.

5. The receiver of claim 1, wherein the second error-correcting module error-corrects the input signal by regarding the unreliable-locations indicated by the indication signal as erasure locations.

6. The receiver of claim 1, further comprising a selecting module, wherein the first error-correcting module further generates a first flag signal to indicate whether the input signal is successively error-corrected by the first error-correcting module to generate the first candidate signal, and the selecting module selects one of the first and second candidate signals to be the output signal according to the first flag signal.

7. The receiver of claim 6, further comprising a selecting module, wherein if the first flag signal indicates that the input signal is successively error-corrected by the first error-correcting module to generate the first candidate signal, the selecting module selects the first candidate signal to be an output signal; and if the first flag signal indicates that the input signal is not successively error-corrected by the first error-correcting module to generate the first candidate signal, the selecting module further determines whether to select the second candidate signal to be the output signal.

\* \* \* \* \*